United States Patent [19]

Hughes et al.

[11] 4,193,654

[45] Mar. 18, 1980

[54] ELECTRICAL CONNECTOR RECEPTACLES

[75] Inventors: Donald W. K. Hughes, Mechanicsburg; Ronald W. Myers, Landisburg, both of Pa.

[73] Assignee: AMP Incorporated, Harrisburg, Pa.

[21] Appl. No.: 967,441

[22] Filed: Dec. 7, 1978

Related U.S. Application Data

[63] Continuation-in-part of Ser. No. 940,536, Sep. 8, 1978.

[51] Int. Cl.[2] ........................ H01R 13/54; H05K 1/12

[52] U.S. Cl. ............................ 339/17 LC; 339/91 R; 339/220 R; 339/276 SF

[58] Field of Search .............. 339/17 C, 17 LC, 17 D, 339/91 R, 125 R, 126 R, 176 M, 220 R, 221 R, 221 M, 276 SF

[56] References Cited

U.S. PATENT DOCUMENTS

| | | | |
|---|---|---|---|
| 3,850,497 | 11/1974 | Krumreich et al. | 339/221 M |
| 4,042,287 | 8/1977 | Heinonen et al. | 339/176 M |
| 4,071,696 | 1/1978 | Anderson | 339/91 M |
| 4,153,327 | 5/1979 | Johnson | 339/205 |

*Primary Examiner*—Neil Abrams
*Attorney, Agent, or Firm*—Frederick W. Raring

[57] ABSTRACT

Electrical connector receptacle comprises an insulating housing having a plug-receiving end, a rearward end, and a plug-receiving opening extending into the plug-receiving end. A plurality of electrical conductors are provided in and on the housing, each conductor having contact spring portions at one end, an intermediate portion, and a second end portion. The contact spring portion extends from an internal sidewall at the mating end diagonally into the plug-receiving opening. The intermediate portion of each conductor extends from the mating end across an external sidewall, across the rearward end and beyond the other external sidewall. The connector is intended for mounting on a circuit board having holes which receive the other ends of the conductors so that the sidewalls from which the contact springs extend is remote from the circuit board.

7 Claims, 11 Drawing Figures

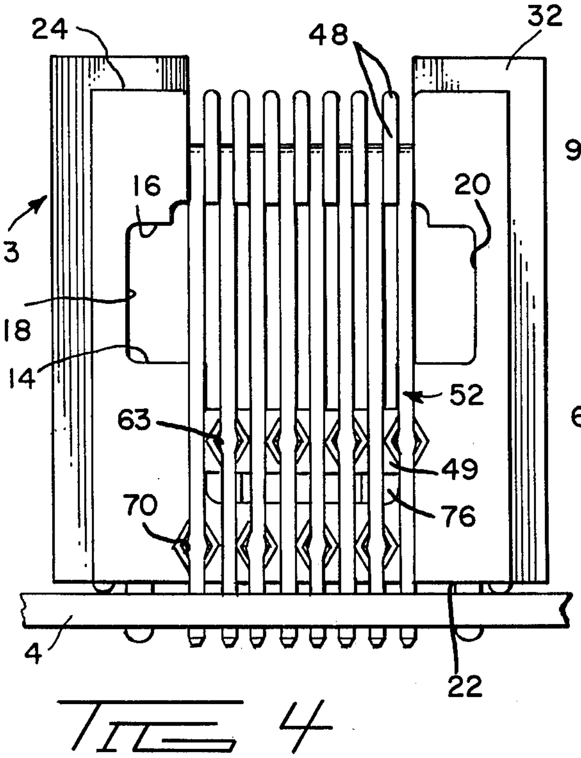
FIG. 4
FIG. 7
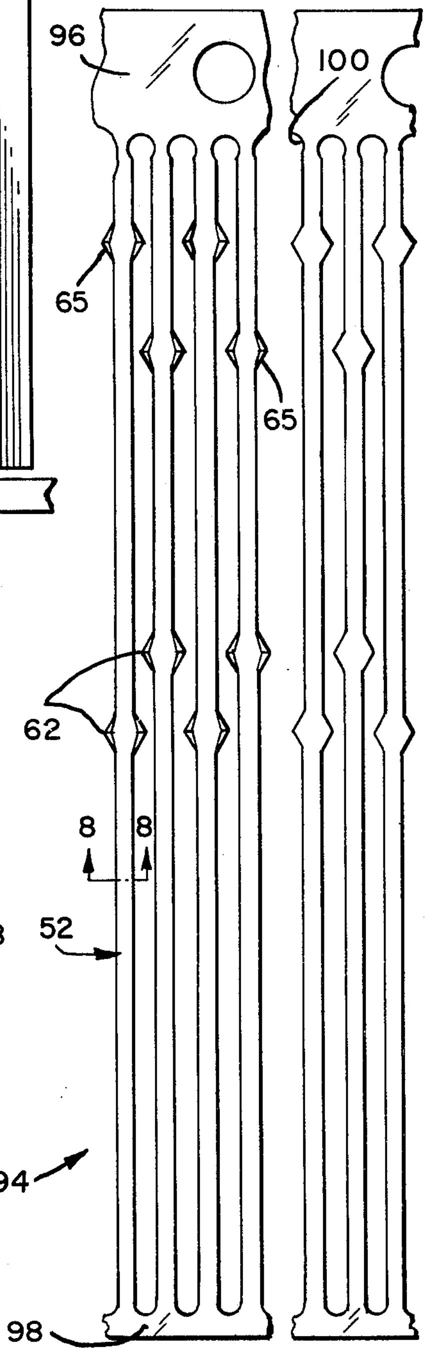
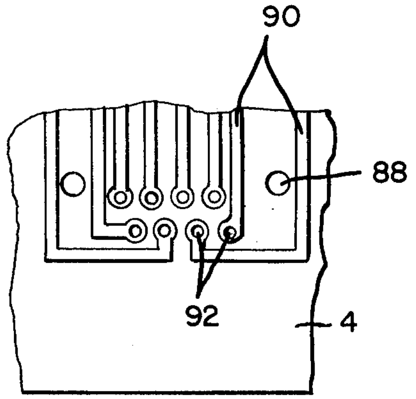
FIG. 6

ELECTRICAL CONNECTOR RECEPTACLES

This application is a continuation-in-part of application Ser. No. 940,536 filed Sept. 8, 1978.

DESCRIPTION

FIELD OF THE INVENTION

This invention relates to electrical connector receptacles of a type which are intended to receive connector plugs.

BACKGROUND OF THE INVENTION

U.S. Pat. No. 3,850,497 describes in detail a connector receptacle of a type which is intended for use in the telephone industry. The receptacle described in this patent comprises an insulating housing having a plug-receiving end and a plug-receiving opening extending into the plug-receiving end. A plurality of circular openings extend through the housing from the plug-receiving end to the rearward end of the housing and contact springs extending from these circular openings diagonally into the plug-receiving opening so that when a plug is inserted into the receptacle, the contact members on the plug will engage the contact springs. The contact springs are in the form of wires and are connected by means of crimped electrical connections to lead wires. These crimped connections are contained in the circular openings in the housing and the lead wires extend from the circular openings and away from the housing at the rearward end thereof. The commonly used type of connector plug which is intended to be mated with connector receptacles of the type described above is described in U.S. Pat. No. 3,954,320.

The connector receptacle described in U.S. Pat. No. 3,850,497 has been widely adopted in the telephone industry and it is being used to an increasing extent on equipment other than telephone equipment, for example, data processing equipment which may be installed adjacent to a telephone exchange, small computers, and similar equipment. The use of these connector receptacles in such related equipment often requires that the receptacle be mounted on a circuit board, but the connector receptacle shown in U.S. Pat. No. 3,850,497 cannot be readily or easily connected to conductors on a circuit board.

Application Ser. No. 940,536 discloses and claims a connector receptacle of the general class which is disclosed in U.S. Pat. No. 3,850,497, and which is dimensioned to receive a connector plug as described in U.S. Pat. No. 3,954,320. The receptacle disclosed in application Ser. No. 940,536 has stamped and formed electrical conductors therein rather than the wire type conductors of U.S. Pat. No. 3,850,497 and one end of each stamped and formed conductor extends beyond the housing of the connector so that the connector can be mounted on a circuit board with the ends of the conductors extending into openings in the circuit board. These ends of the conductors can then be soldered to conductors on the circuit board in the usual manner.

The connector receptacle shown in Application Ser. No. 940,536 is constructed such that when it is mounted on the circuit board, the conductors extend from an internal sidewall of the housing which is proximate to the circuit board and the plug must be inserted in an orientation such that the latch arm of the plug is remote from the circuit board; i.e., after the plug has been fully inserted into the receptacle, the position of the latch arm is immediately apparent and the plug can be removed by simply depressing the latch arm and pulling the plug from the receptacle.

This arrangement is desirable under many circumstances, particularly where it is necessary that the plug be inserted and removed from the receptacle frequently. However, under some circumstances the manufacturer of the equipment requiring connector receptacles prefers that the connectors be in an orientation such that removal of the connector plug is discouraged rather than encouraged. For example, where the plug and connector receptacle part of the circuit is relatively permanent and the plug will be removed only infrequently for extensive servicing. Under such circumstances, removal of the plug by a person unfamiliar with the equipment with accompanying damage or deactivation of the equipment will be discouraged. The present invention is therefore directed to the achievement of a connector receptacle which is intended for mounting on a circuit board and which receives a connector plug in an orientation such that the latch arm on the plug is proximate to the surface of the circuit board so that removal of the plug from the receptacle will not be encouraged.

A connector receptacle in accordance with the invention comprises an insulating housing having a plug-receiving opening extending therethrough from its plug-receiving end to its rearward end. Stamped and formed conductors are mounted in and on the housing, each conductor having a first end portion which serves as a contact spring and which extends from the location between one internal sidewall of the opening and one external sidewall of the housing diagonally into the plug-receiving opening. An intermediate portion of each conductor extends across the one external sidewall and then across the rearward end of the housing so that the other end of each conductor projects beyond the other external sidewall. The connector is intended for mounting on a circuit board with the other external sidewall adjacent to the surface of the board so that when a plug member is inserted into the plug-receiving opening, the latch arm of the plug will be adjacent to the surface of the circuit board and, therefore, not immediately accessible for removal although the plug can be removed when required.

DESCRIPTION OF THE DRAWINGS

FIG. 4 is a view of the rearward end of the connector looking in the direction of the arrows 4—4 of FIG. 3.

FIG. 7 is a plan view of a section of the strip of conductors intended for assembly to a connector housing in accordance with the invention.

FIG. 8 is a view taken along the line 8—8 of FIG. 7.

PRACTICE OF THE INVENTION

Figure 1:
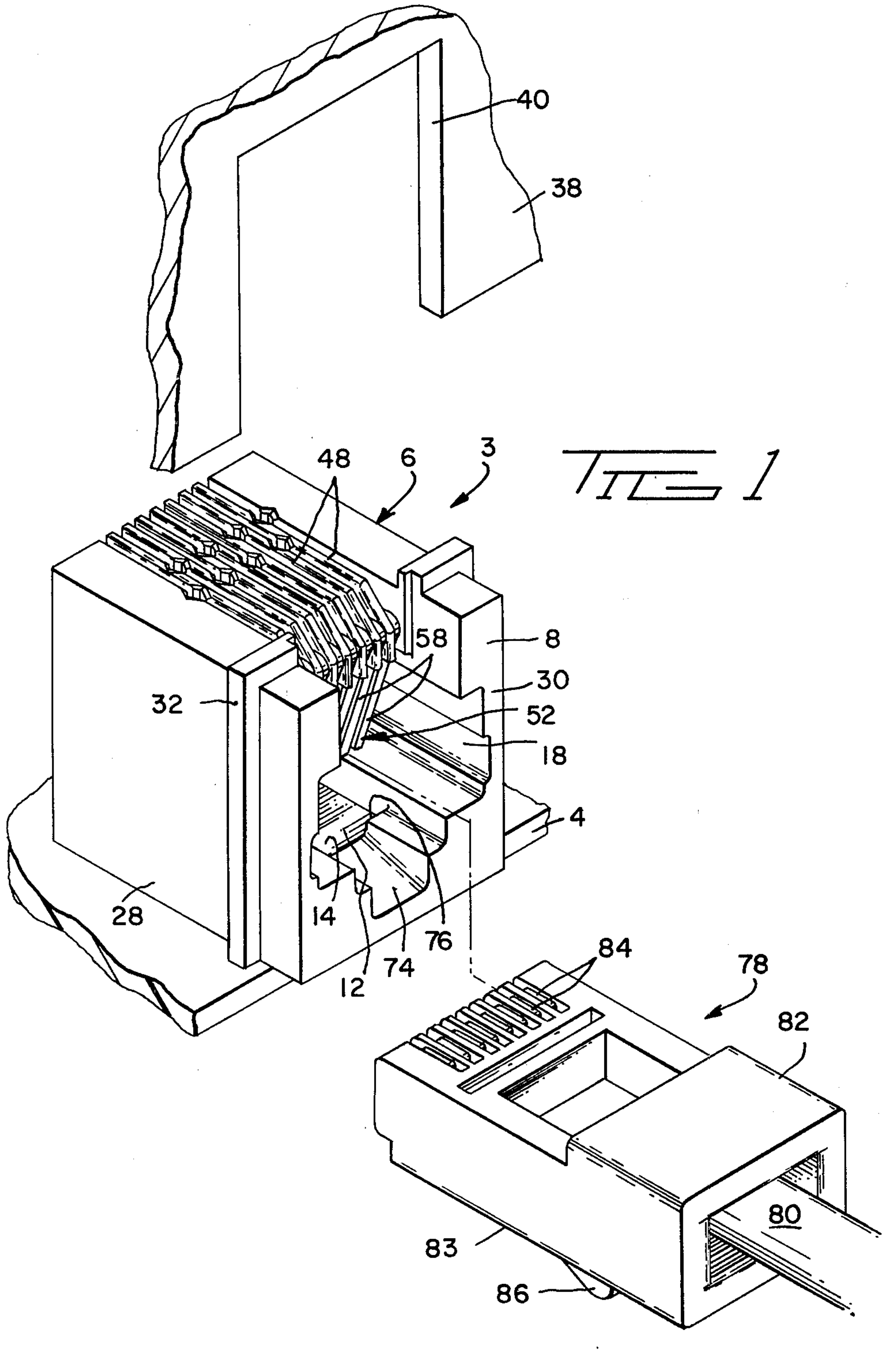
FIG. 1 is a perspective view showing a connector receptacle in accordance with the invention mounted on a circuit board with a complementary connector plug exploded from the receptacle.
Figure 2:
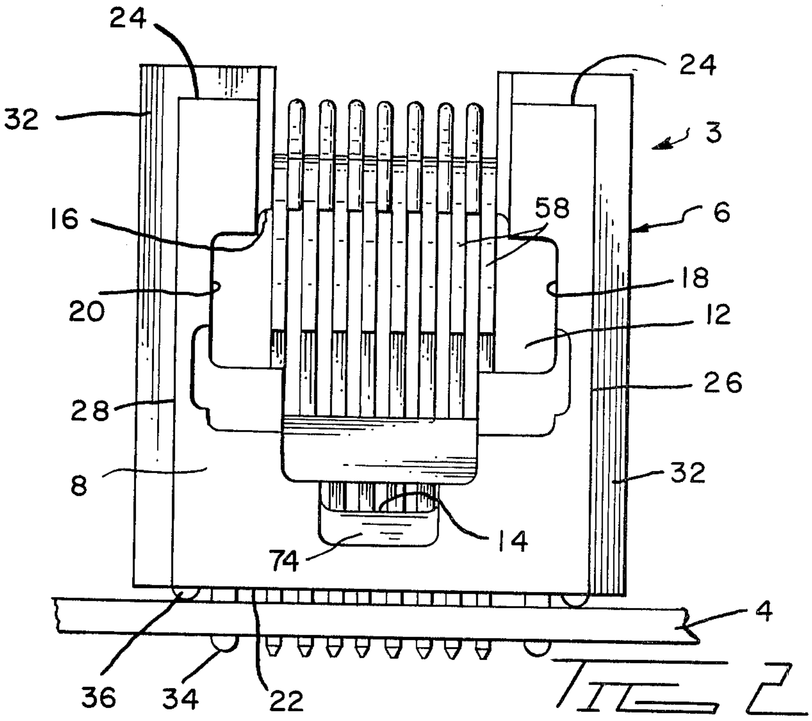
FIG. 2 is a frontal view of the connector receptacle.
Figure 3:
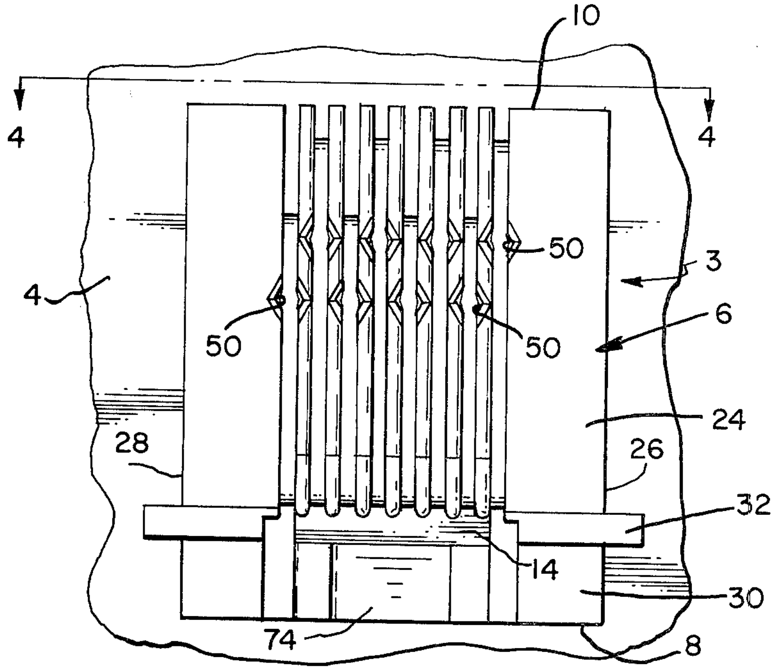
FIG. 3 is a top plan view of the receptacle.
Figure 6:
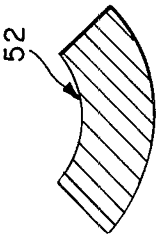
FIG. 6 is a fragmentary view of a portion of the surface of a circuit board showing conductors on the surface board and conductor-receiving holes in the board located to receive the conductors of a receptacle.

FIG. 1 shows a connector receptacle 3 in accordance with the invention mounted on a circuit board 4 and serving to connect conductors in a cable 80 having a plug 78 on its end to conductors on the underside of the circuit board 4. The receptacle 3 comprises a molded insulating housing 6 of suitable thermoplastic material, such as a filled nylon, having a plug-receiving end 8, a rearward end 10, and a plug-receiving opening 12 extending into the plug-receiving end. The opening 12 has lower and upper (as viewed in FIGS. 2 and 4) internal sidewalls 14, 16, and opposed endwalls 18, 20. The external surface of the housing comprises lower and upper external sidewalls 22, 24 and external endwalls 26, 28. The endwalls and the internal sidewall 14 extend beyond the internal sidewall 16 at the plug-receiving end 8 as shown at 30 in FIG. 1 and flanges 32 are provided on the external endwalls and on the upper external sidewall 24. Integral mounting pins or posts 34 extend from the external sidewall 22 and are dimensioned to be received for mechanical mounting purposes in openings 88 in the circuit board 4, as shown in FIG. 6. Additionally, standoff bosses 36 are provided on the lower sidewall 22 to support the sidewall slightly above the surface of the circuit board when it is mounted thereon in order to facilitate soldering.

The receptacle shown is mounted adjacent to an edge of the circuit board 4 with the intention that a panel member 38 extend to this edge, the panel having an opening 40 through which the portions 30 of the housing will extend with the flange 32 against the rearward surface of the panel.

A plurality of side-by-side recesses 42 are provided in the mating end 8 of the housing 6 between the internal sidewall 16 and the external sidewall 24. These recesses merge with spaced apart grooves or channels 44 in the internal sidewall 14 and with spaced apart channels 46 in the external sidewall 24. Adjacent channels are separated by barriers as shown at 48 and the channels and the barriers extend downwardly as viewed in FIGS. 4 and 5 over the rearward end of the housing to the lower external sidewall 22. As shown best in FIG. 4, the upper portion of the opening 12 extends entirely through the housing but a web 49 is provided at the rearward end which extends between the lower portions of the internal endwalls 18, 20 and the channels and barriers are provided on the external surface of this web. Openings are provided in the web on each side at its lower end to provide clearance for core pins which form retaining shoulders 76 in the plug-receiving opening as described below.

Staggered recesses 50 in the sides of the channels are provided on the external sidewall 24, on the web 49 as shown at 63, and on the lower portion of the rearward end of the housing as shown at 70. These recesses extend into the barriers on each side of each channel and receive retaining barbs which extend laterally from the conductors and serve to retain the conductors in the channels.

The spaced-apart parallel conductors 52 each have an elongated intermediate portion 54 which extends across the upper external sidewall 24, which is bent downwardly at 64, and which extends across the rearward end of the housing as shown at 66. A first end of each conductor is reversely bent having its bent portion 56 disposed in a recess 42 and having a contact spring portion 58 extending diagonally into the plug-receiving opening 12. A second end 60 of each conductor extends downwardly beyond the lower sidewall 22 and is adapted to be soldered to a conductor on the circuit board 4. The retaining barbs which are received in the recesses 50, 63, and 70 are shown at 62 and 65.

A centrally located downwardly inclined recess 74, as viewed in FIG. 1, is provided in the internal sidewall 14 and extends to the mating end 8 of the housing. Spaced-apart shoulders 76 are provided on each side of this recess which face towards the rearward end 10 of the housing, these shoulders being cooperable with shoulders 85 on the latch arm of the plug member which is described below.

The plug 6 is of the type fully described in U.S. Pat. No. 3,954,320 and is of a standard type which was introduced by the telephone industry. The plug is installed on the end of a multi-conductor cable 80 and the conductors of the cable are in electrical contact with terminals 84 which extend upwardly to the upper surface 82 of the plug, the contact surface of these terminals being shown in FIG. 1. The latch arm 86 extends from the lower surface 83 of the plug and the rearwardly facing shoulders 85 on each side of this latch arm engage the shoulders 76 of the housing when the plug is fully inserted into the opening 12. The disclosed receptacle has eight conductors and is designed to receive a plug 78 having a like number of terminals.

The disclosed embodiment is intended for use on a circuit board having conductors 90 thereon, as shown in FIG. 6, which extend to holes 92 in the circuit board, these holes being in two rows with the holes in one row staggered with respect to the holes in the other row. Therefore, the ends 60 of the conductors 52 of the conductor must be staggered with respect to each other. The staggered arrangement is achieved by providing the channels on the rearward end 10 having different depths; alternate channels are relatively deep so that the ends 60 of the conductors in these deep channels will form one row and the remaining channels are relatively shallow so that the conductors in these remaining channels will be offset and staggered with respect to the conductors in the deeper channels.

FIG. 7 shows a continuous strip 94 of conductors intended for assembly to connector housings in accordance with the invention, the flat blank being shown on the right and a short section of formed strip being shown on the left. The strip comprises spaced-apart continuous carrier strips 96, 98 with the conductors extending between these carrier strips. Each conductor has a reduced wide neck 100 adjacent to the carrier strip 96, this neck being the location at which the conductor is severed from the carrier strip at the time of assembly of the conductors to the housing. FIG. 7 shows the staggered barbs on the conductors which enter the recesses described above, to retain the conductor in the housing.

As shown in FIG. 8, the individual conductors may be formed into an arcuate shape. Aside from this arcuate form, the conductors are of extremely simple shape and the manufacture of the strip requires little more than the blanking operation to blank out the material between adjacent conductors.

Figure 9:
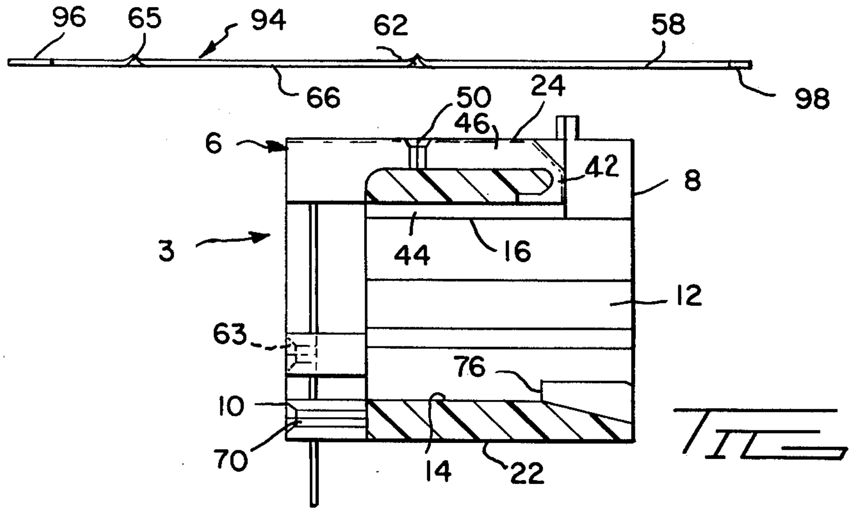
FIGS. 9–11 are sectional side views of a housing and a section of conductor strip illustrating the method of assembling the conductors to a connector housing.
Figure 10:
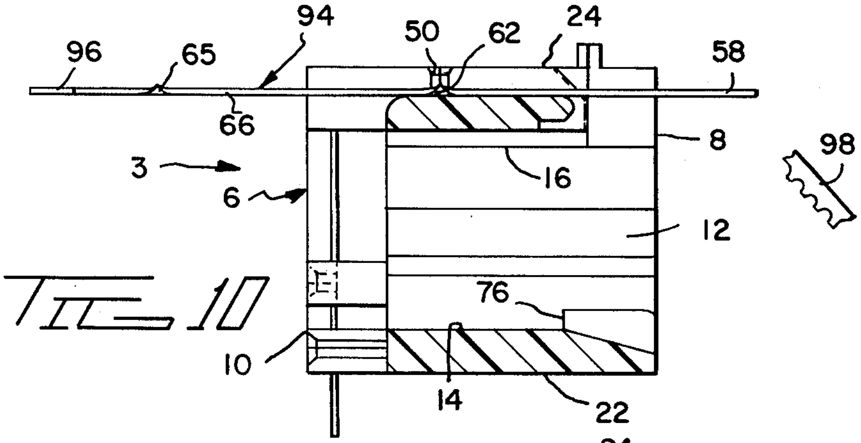

The conductors in strip form can be assembled to the housings in accordance with the general prinsiples discussed in Application Ser. No. 940,536. A section of the strip having the required number of conductors for the housing is severed from the strip and the conductors of the severed section are placed in alignment with the spaced-apart channels 46 in the external sidewall 24, as shown in FIG. 9. This section is moved downwardly (FIG. 10) so that the conductors enter these channels in the upper sidewall. Thereafter, the carrier strip 98 is severed from the section of conductor strip and the ends of the conductors which extend beyond the plug-receiving end of the housing are bent downwardly and into the plug-receiving opening. The bending of these ends can be carried out in two steps, a first step in which they are bent downwardly so that they extend normally of the intermediate portions of the strip and across the plug-receiving opening and a second step in which they are bent into the opening.

Figure 11:
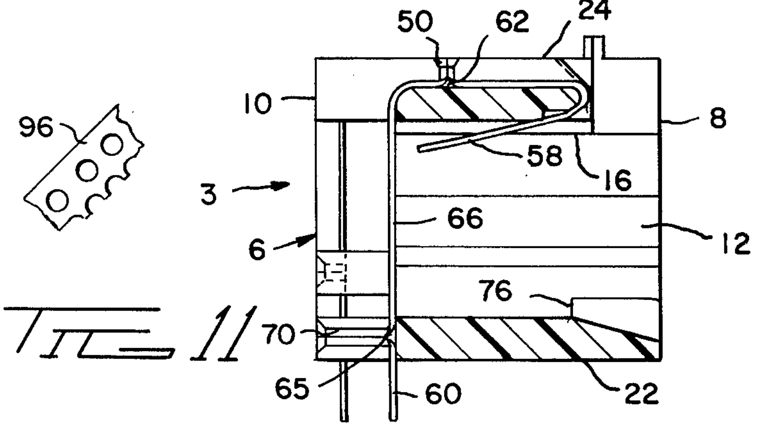

After the contact springs have been formed, the carrier strip 96 is severed from the lefthand ends of the conductors and these left-hand ends are bent downwardly, as viewed in the drawings, so that they enter the channels on the rearward end of the housing as shown in FIG. 11. The tooling for carrying out these insertion, bending, and severing steps can be of the general type disclosed in Application Ser. No. 940,536.

Figure 5:
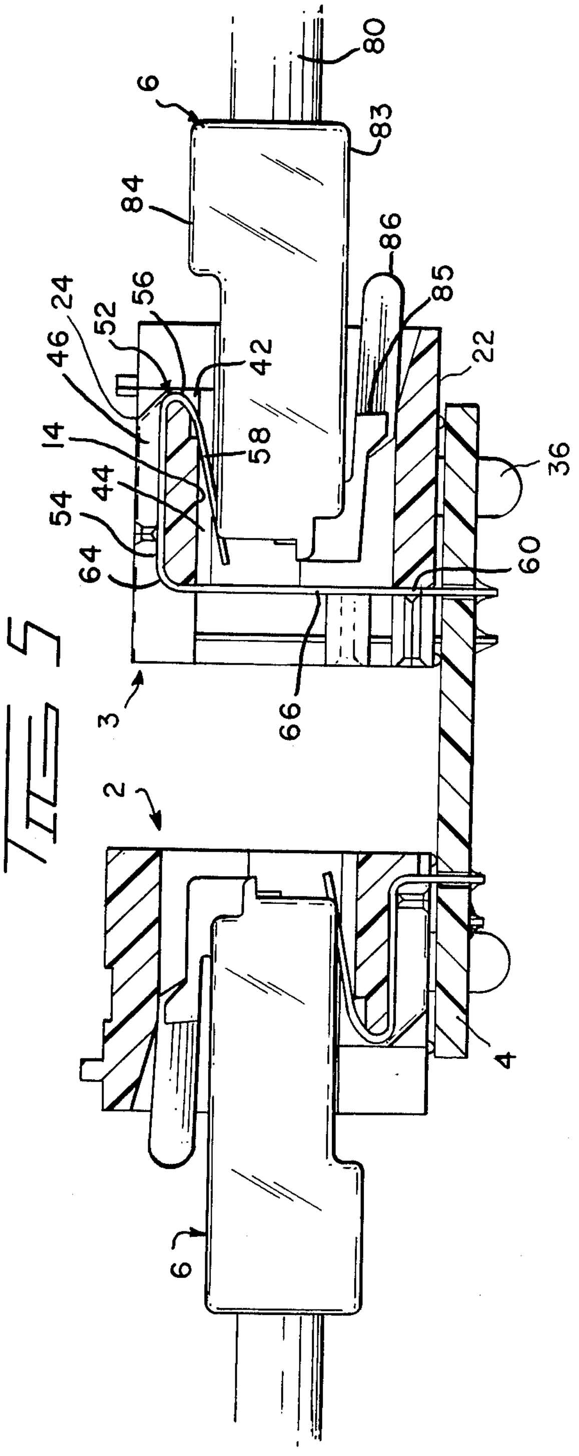
FIG. 5 is a cross-sectional view of a connector receptacle in accordance with the invention and a connector receptacle as described in Application Ser. No. 940,536, both of these receptacles being mounted on a circuit board.

The connector receptacle 3 is mounted on the circuit board 4 by merely aligning the ends 60 of the conductors with the holes 92 and aligning the integral posts 34 with the holes 88 and inserting the posts and conductors into the holes in the board until the standoff bosses 36 are against the surface of the board. The protruding ends of the conductors 60 can then be soldered to the conductors 90 of the circuit board. FIG. 5 shows a receptacle in accordance with the invention on the right side of a circuit board and a connector 2 in accordance with Application Ser. No. 940,536 on the left. It will be readily apparent that the latch member of the plug on the left is readily accessible so that the plug can be removed from the receptacle 2 with ease. The latch member of the plug which is mated with the connector receptacle 3, however, is on the underside of the body of the plug so that while the plug can be removed if necessary, removal is not encouraged.

We claim:

1. An electrical connector receptacle of the type comprising an insulating housing having a plug-receiving end and a rearward end, a plug-receiving opening extending into said plug-receiving end, said opening having opposed internal sidewalls and opposed internal endwalls, said housing having oppositely directed external sidewalls and oppositely directed external endwalls, a plurality of electrical conductors in side-by-side spaced-apart relationship, each of said conductors comprising a contact spring extending from one of said internal sidewalls at a location adjacent to said plug-receiving end diagonally into said opening and towards the opposite internal sidewall, and each conductor having a lead portion extending from said plug-receiving end through said housing between said one internal sidewall and the adjacent external sidewall and towards said rearward end, said plug-receiving opening being dimensioned to receive a connector plug having spaced-apart contact members therein which engage said contact spring portions of said conductors, said connector receptacle being characterized in that:

said adjacent external sidewall and said rearward end have a plurality of side-by-side channels therein, said channels in said rearward end being in alignment with said channels in said adjacent external sidewall, and each of said conductors comprises a single elongated strip of stamped and formed sheet metal, an intermediate section of said strip being disposed in one of said channels in said adjacent external sidewall, said strip being bent at said rearward end and extending across said rearward end in one of said channels in said rearward end, said strip being reversely bent at said plug-receiving end and having a first end portion extending into said plug-receiving opening, a second end portion of said strip extending beyond the other one of said external sidewalls, said first end portion constituting said contact spring, said intermediate portion and said second end portion constituting said lead portion.

2. An electrical connector assembly as set forth in claim 1 having interengaging means effective between each of said conductors and said housing for maintaining said conductors in assembled relationship to said housing.

3. An electrical connector as set forth in claim 2, said interengaging means comprising barbs on said intermediate portion of each of said conductors, said barbs extending into surface portions of said channels.

4. An electrical connector as set forth in claim 3, each of said conductors having at least two barbs, one of said barbs of each conductor extending into surface portions of its associated channel in said adjacent external sidewall and the other of said barbs extending into said associated channel in said rearward end.

5. An electrical connector as set forth in either of claims 3 or 4, said barbs on each conductor being offset with respect to said barbs on adjacent conductors.

6. An electrical connector as set forth in claim 1, said connector being intended for mounting on a panel-like member with said other one of said external sidewalls proximate to said panel-like member, said housing having mounting and supporting means on said other one of said external sidewalls for supporting said housing on said panel-like member.

7. An electrical connector receptacle of the type comprising an insulating housing having a plug-receiving end and a rearward end, a plug-receiving opening extending into said plug-receiving end, said opening having opposed internal sidewalls and opposed internal endwalls, said housing having oppositely directed external sidewalls and oppositely directed external endwalls, a plurality of electrical conductors in side-by-side spaced-apart relationship, each of said conductors comprising a contact spring extending from one of said internal sidewalls at a location adjacent to said plug-receiving end diagonally into said opening and towards the opposite internal sidewall, and each conductor having a lead portion extending from said plug-receiving end through said housing between said one internal sidewall and the adjacent external sidewall and towards said rearward end, said plug-receiving opening being dimensioned to receive a connector plug having spaced-apart contact members therein which engage said contact spring portions of said conductors, said connector receptacle being characterized in that:

said adjacent external sidewall and said rearward end have a plurality of side-by-side channel means therein, said channel means in said rearward end being in alignment with said channel means in said adjacent external sidewall, each of said conductors comprises a single elongated strip of stamped and formed sheet metal, an intermediate section of said strip being disposed in one of said channel means in said adjacent external sidewall, said strip being bent at said rearward end and extending across said rearward end in one of said channel means in said rearward end, said strip being reversely bent at said plug-receiving end and having a first end portion extending into said plug-receiving opening, a second end portion of said strip extending beyond the other one of said external sidewalls, said first end portion constituting said contact spring, said intermediate portion and said second end portion constituting said lead portion, said channel means in said rearward end comprising alternating relatively deep and relatively shallow channels whereby said second end portions of said strips which extend beyond the other one of said external sidewalls are offset.

* * * * *